United States Patent [19]
Bez et al.

[11] Patent Number: 5,990,526
[45] Date of Patent: Nov. 23, 1999

[54] MEMORY DEVICE WITH A CELL ARRAY IN TRIPLE WELL, AND RELATED MANUFACTURING PROCESS

[75] Inventors: Roberto Bez; Alberto Modelli, both of Milan, Italy

[73] Assignee: STMicroelectronics S.r.l., Agrate Brianza, Italy

[21] Appl. No.: 09/027,343

[22] Filed: Feb. 20, 1998

[30] Foreign Application Priority Data

Feb. 20, 1997 [IT] Italy .................................. MI97A0357

[51] Int. Cl.[6] ............................ H01L 29/76; H01L 29/94; H01L 29/792; H01L 27/10
[52] U.S. Cl. .......................... 257/390; 257/391; 257/206; 257/401; 257/326
[58] Field of Search ...................................... 257/326, 390, 257/391, 206, 401

[56] References Cited

U.S. PATENT DOCUMENTS

| | | | |
|---|---|---|---|
| 4,933,736 | 6/1990 | Conner et al. | 257/390 |
| 5,031,018 | 7/1991 | Shirato et al. | 257/390 |
| 5,396,100 | 3/1995 | Yamasaki et al. | 257/390 |
| 5,650,956 | 7/1997 | Choi | 257/390 |

*Primary Examiner*—Valencia Martin-Wallace
*Assistant Examiner*—Jesse A. Fenty
*Attorney, Agent, or Firm*—David V. Carlson; Dennis M. de Guzman; Seed and Berry LLP

[57] ABSTRACT

A memory device comprising a semiconductor material substrate with a dopant of a first type, a first semiconductor material well with a dopant of a second type formed in the substrate; a second semiconductor material well with a dopant of the first type formed in the first well, an array of memory cells formed within the second well. Each memory cell comprises a first electrode and a second electrode respectively formed by a first and a second doped regions with dopant of the second type formed in the second well, and a control gate electrode. The memory array comprises a first plurality of strips of conductive material extending over the second well in a first direction and forming rows of memory cells, a second plurality of strips of conductive material extending over the second well in a second direction substantially orthogonal to the first direction and forming columns of memory cells, each strip of the second plurality electrically contacting the first electrodes of a respective group of memory cells, a third plurality of strips of conductive material extending over the second well in the second direction and intercalated to the strips of the second plurality, electrically contacting the second electrodes of the cells. A fourth plurality of strips of conductive material is provided extending over the second well in the second direction and intercalated to the strips of the second and the third pluralities, electrically contacting the second well in a succession of contact points distributed longitudinally to each strip of the fourth plurality.

10 Claims, 3 Drawing Sheets

MEMORY DEVICE WITH A CELL ARRAY IN TRIPLE WELL, AND RELATED MANUFACTURING PROCESS

TECHNICAL FIELD

The present invention concerns a memory device integrated on a semiconductor substrate and having a matrix-type topography memory cell array placed upon a triple well configuration on the semiconductor substrate. The present invention also relates to a manufacturing process of making such memory device.

BACKGROUND OF THE INVENTION

It is known that memory devices, such as non-volatile memory devices like EEPROMs and Flash EEPROMs, comprise a memory cell array arranged in rows (word lines) and columns (bit lines). Each memory cell is substantially formed by a MOS transistor comprising an electrically insulated gate electrode, a control gate electrode, a drain electrode and a source electrode.

The control gate electrode of each cell is connected to a respective row of the array, and similarly the drain electrode is connected to a respective column; the source electrodes of the cells are all connected to each other.

The memory cell array can be formed directly in the substrate common to the entire semiconductor chip wherein the control circuitry is also integrated. In this case, a bulk electrode of the memory cells is biased as a substrate potential, generally a reference potential.

Non-volatile EEPROM and Flash EEPROM memory devices are known wherein the memory cells are fabricated inside a first semiconductor material well with a dopant of a first type (e.g., P-type), said first semiconductor material well being in turn contained within a second semiconductor material well with a dopant of a second type (e.g., N-type) that isolates the first semiconductor material well containing the memory array from the substrate. Devices manufactured of this kind are generally called "triple well devices".

In this way, i.e., the triple well configuration, it is possible to bias the bulk electrode of the memory cells at a potential different from that of the substrate. This is particularly advantageous for Non-volatile EEPROM and Flash EEPROM memories because it allows different methods for performing reading, programming and erasing operations, particularly in view of a possible reduction in the current consumption during said operations and/or of the use of lower supply voltages for the memory device.

A drawback of the use of a triple well device is given by the fact that the first semiconductor material well with dopant of the first type containing the memory cells, due to its limited depth, has a higher resistivity than the substrate does. This can cause undesired electric potential differences between different zones of the memory array during the operations involving significant bulk currents (such as, for example, programming and erasing operations). In a conventional memory array wherein the memory cells are formed directly within the substrate, it is sufficient to contact the substrate along the periphery of the array to guarantee that the bulk electrode potential of the memory cells is substantially constant within the array. This is however not sufficient for a memory array formed inside a triple well device.

SUMMARY OF THE INVENTION

In view of the state of the art described, it is an object of the present invention to provide a memory device with a memory cell array formed in a triple well configuration upon a semiconductor substrate, which is not affected by the above-mentioned drawbacks.

According to the present invention, the object is achieved by means of a memory device comprising:

a semiconductor material substrate with a dopant of a first type;

a first semiconductor material well with a dopant of a second type formed in the substrate;

a second semiconductor material well with a dopant of the first type formed in said first well;

an array of memory cells formed within said second semiconductor material well, said memory cell array comprising:

a bidimensional arrangement of memory cells formed in said second semiconductor material well, each cell comprising a first electrode and a second electrode respectively formed by a first and a second doped regions with dopant of the second type, and a control gate electrode.

a first plurality of parallel strips of conductive material extending over said second semiconductor material well in a first direction and forming rows of memory cells, each strip of the first plurality forming the control gate electrodes of a respective group of memory cells.

a second plurality of parallel strips of conductive material extending over said second semiconductor material well in a second direction substantially orthogonal to said first direction and forming columns of memory cells, each strips of said second plurality electrically contacting the first electrodes of a respective group of memory cells; and a third plurality of parallel strips of conductive material extending over said second semiconductor material well in said second direction and intercalating to the strips of the second plurality, said strips of the third plurality electrically contacting the second electrodes of the cells;

characterized by comprising a fourth plurality of strips of conductive material extending over said second semiconductor material well in said second direction and intercalating to the strips of said second and third pluralities, said strips of the fourth plurality electrically contacting the second semiconductor material well in a succession of points distributed longitudinally to each strip of said fourth plurality.

In other words, the second semiconductor material well wherein the memory cell array is formed and which constitutes the bulk electrode of the memory cells is contacted in a succession of contact points of said strips of the fourth plurality inside the memory array.

Thanks to the present invention, it is possible to bias the second semiconductor material well wherein the memory cells are formed in a more uniform way than contacting the second semiconductor material well only along its periphery. In this way, all the memory cells are, even in different operations, all in the substantially same operating conditions.

The number of strips of said fourth plurality to intercalate to the strips of the second and third pluralities may be optimized in view of the bulk current during the programming and erasing operations.

Also according to the present invention, there is provided a process for the manufacturing of said memory device, comprising the following steps:

a) forming the first semiconductor material well in the substrate;

b) forming said second semiconductor material well in the first well;

c) forming said first plurality of strips of conductive material;

d) forming in the second semiconductor material well the first and second doped regions constituting the first and second electrodes of the memory cells;

e) forming over the second semiconductor material well a layer of insulating material;

f) defining in the layer of insulating material contact openings to the first and second doped regions;

g) simultaneously forming, over the layer of insulating material, the second plurality of conductive material strips electrically contacting the first doped regions through respective contact openings, and the third plurality of conductive material strips contacting the second doped regions through respective contact openings, wherein the process further provides, in step f), openings in the layer of insulating material of further contact openings to the second semiconductor material well, and, in step g), the formation of the fourth plurality of conductive material strips, intercalated to the strips of the second and third pluralities, which contact the second semiconductor material well through said further contact openings.

The advantage of such a process is that of not requiring addition of further steps to conventional process flow.

These and other features and advantages of the present invention will be made apparent by the following detailed description of some preferred embodiments, illustrated as non-limiting examples in the annexed drawings.

DETAILED DESCRIPTION OF THE INVENTION

With reference to FIG. 1 to 5, a portion of a memory cell array is shown therein. The memory cell array is incorporated in a triple well memory device, such as an EEPROM or a Flash EEPROM memory. First of all, referring to the cross-sectional views of FIGS. 2 to 5, a semiconductor material substrate 10 is visible, doped with a dopant of a first type (e.g. P-type), and forms the common substrate of a semiconductor chip wherein the memory device is integrated. A first semiconductor material well 9 is formed in substrate 10, doped with dopant of a second type (N-type in the shown example). In said first well, a second semiconductor material well 8 is formed, doped with a dopant of the first type.

In the second semiconductor material well 8, the memory cell array (memory array) of the memory device are formed. Following common jargon, the memory device described above is said to have the memory cell array integrated in a triple well configuration.

It is to be noted that, in the same substrate 10, more than one N-type well 9 can be provided, for example, suitable to contain the P-channel MOSFETs of the control circuitry of the memory device. In some of said N-type wells 9, P-type wells similar to the well 8 could be further provided, for example, suitable to contain the N-channel MOSFETs of the control circuitry which necessitates bulk electrode biasing potentials different from the potential of the substrate 10 (the later being normally biased at the reference potential).

Figure 5:
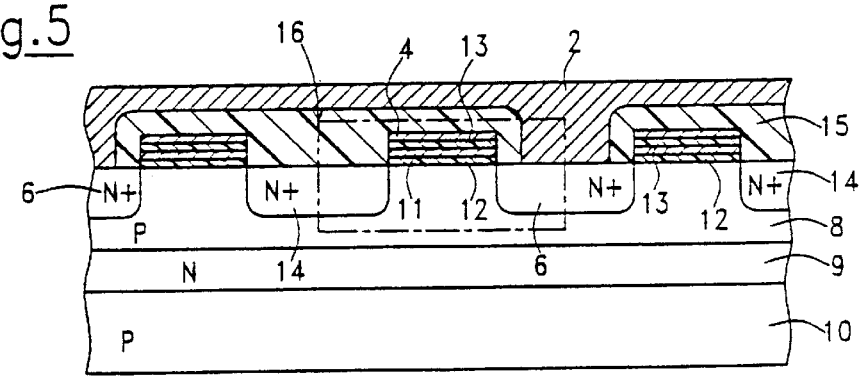

FIG. 5 shows in cross section an elementary cell 16 of the memory array, substantially formed by a MOS transistor comprising a heavily doped N+ semiconductor region 6 constituting the drain electrode of the transistor, a heavily doped N+ semiconductor region 14 constituting the source electrode of the transistor, a gate oxide layer 12, a gate electrode 11 electrically isolated and superimposed over the gate oxide layer, a dielectric layer 13 superimposed over the isolated gate 11 and a control gate electrode 4 superimposed over the dielectric layer 13. The isolated gate electrode 11 and the control gate electrode 4 are typically formed by a first and a second polysilicon layer, respectively.

Conventionally, the memory cell array is arranged in rows 40 (word lines) and column strips 2 (bit lines). As visible in FIG. 4, the rows 40 are formed by parallel strips obtained in the second polysilicon layer, each polysilicon strip that forms a row 40 thus forming the control gate electrodes 4 of a respective group of memory cells.

The column strips or bit lines 2 are formed by metallic strips (typically of aluminum) extending in a direction substantially orthogonal to the rows 40. Each strip 2 electrically contacts the drain electrodes 6 of a respective group of memory cells at contacts 25 provided in a dielectric layer 15 covering the rows 40 wherein the dielectric layer 15 isolated the rows 40 from the overlying strips 2 (FIGS. 2 and 5).

Figure 1:
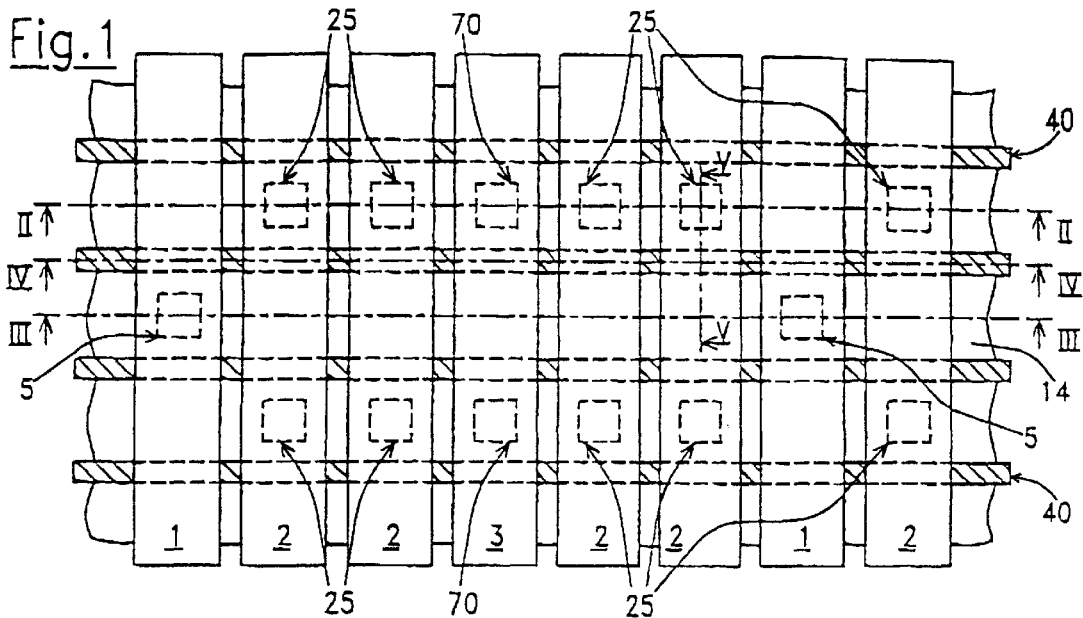
FIG. 1 is a top-plan view of a portion of a memory cell array of a memory device according to a first embodiment of the invention.
Figure 3:
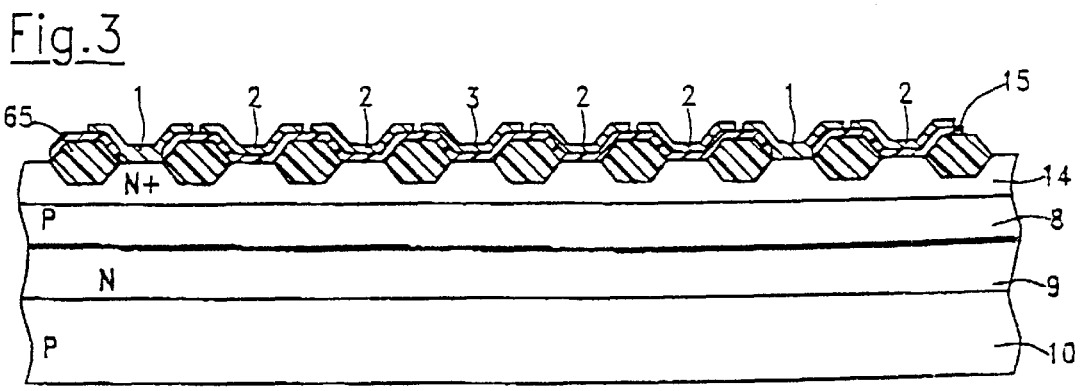
Figure 4:
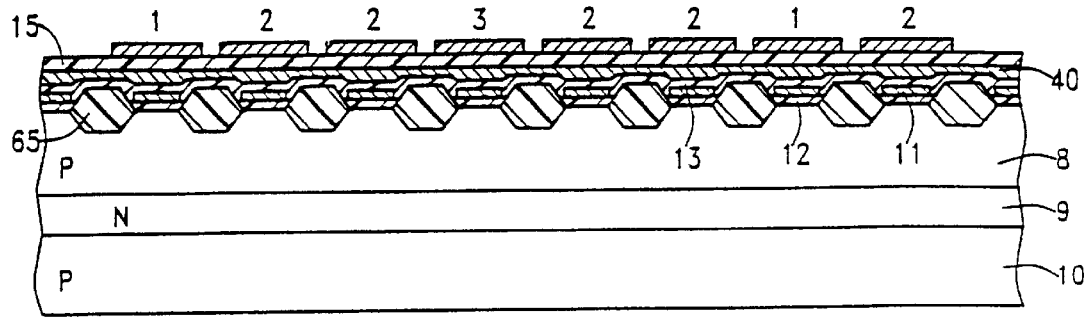

As shown in FIG. 3, the source regions of the transistors forming the memory cells are obtained by providing, every two rows 40, extended regions 14 of heavily doped N+ semiconductor material, said extended regions extending in a direction parallel to the rows 40. These extended regions form a common source electrode for all the memory cells belonging to a pair of adjacent rows 40 between which said regions 14 are formed as shown in FIGS. 1 and 3, regions 14 are then electrically connected together by means of metallic strips 1, similar to the strips 2, substantially parallel to and intercalated with the strips 2 with a prescribed pitch. Said strips 1 electrically contacts, through contacts 5 in the dielectric layer 15, the heavily doped regions 14 and forms the common source electrode of all the memory cells belonging to the two rows 40 adjacent to contact 5. The source regions of all the transistors forming the memory cells are thus electrically connected together.

All the previous descriptions are known in the art.

Figure 2:
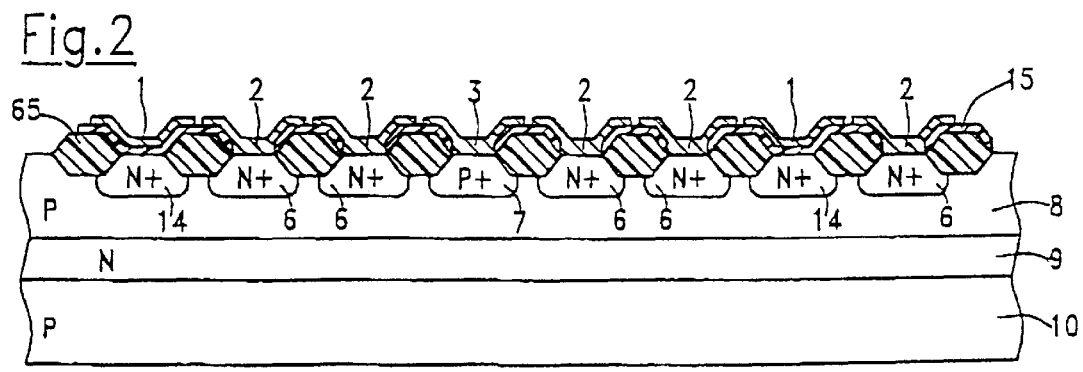
FIGS. 2, 3, 4 and 5 are cross-sectional views of the portion of memory cell array of FIG. 1 along lines II—II, III—III, IV—IV and V—V.

According to the present invention, and as shown in FIGS. 1 and 2, a further plurality of metallic strips 3 are provided, parallel to and intercalated with strips 1 and 2 with a prescribed pitch. The strips 3 electrically contact, through contact openings 70 in the dielectric layer 15, heavily doped P+ regions formed in the second semiconductor material well 8. In this first embodiment of the invention, contacts 70 are aligned with contacts 25 in the direction of the rows 40 while no contacts are provided in alignment with contacts 5 in the direction of rows 40.

Strips 3 electrically contact the second semiconductor material well 8 through the P+ regions 7. Strips 3 are further electrically connected together and to a biasing potential for the second semiconductor material well 8. By providing a suitable distribution of strips 3 among the strips 2 and the strips 1, it is thus possible to bias the second semiconductor material well 8 in a substantially uniform way. The preferred distribution of strips 3 depends on the conductivity of the well 8 and the bulk currents of the memory cells in the programming and erasing operations. Thus, all the memory cells are, although in the different operation modes of the memory device, in the substantially same operating conditions. The P+ regions 7 formed in the second semiconductor material well 8 in correspondence of contacts 70 are provided for assuring a good ohmic contact and for reducing the possible voltage drop between the strips 3 and the second semiconductor material well 8.

A first embodiment of a manufacturing process will be now described which is suitable for obtaining the structure described above.

Figure 6:
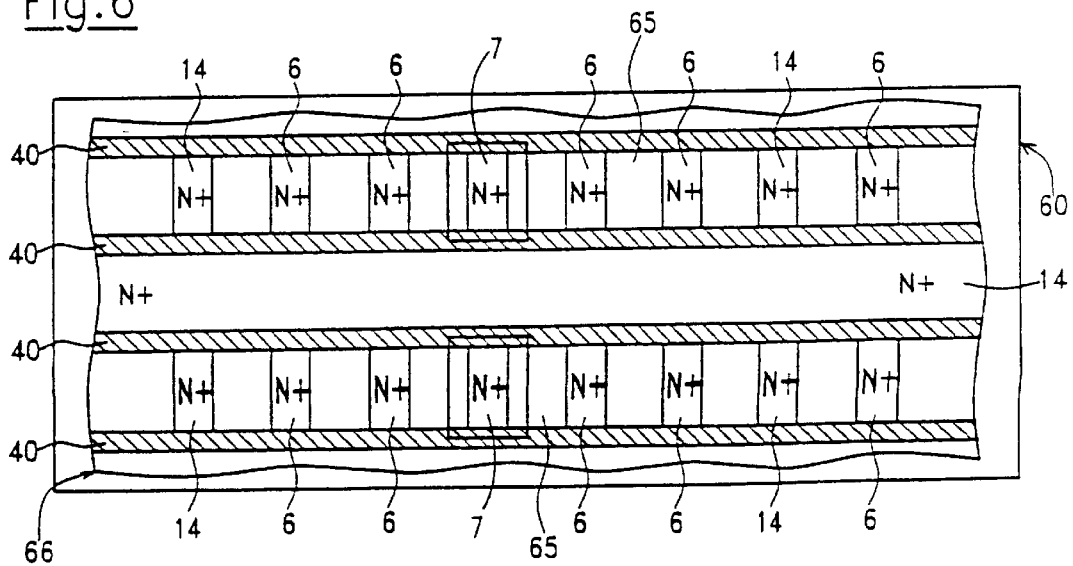
FIG. 6 shows a step of a manufacturing process according to a first embodiment of the invention for obtaining the memory device shown in FIG. 1.

With reference to FIG. 6, a portion of the silicon chip 66 containing the memory cell array is shown wherein the first N-type well 9 and the second P-type well 8 have already been formed in substrate 10, as shown in FIGS. 2–5. In the second well 8, drain regions 6 are already present, separated in the direction of the rows 40 by thick field oxide, or similar dielectric material, regions 65, as well as the common source regions 14 and the word lines 40. The steps for the fabrication of all this are not shown and described in detail because they are conventional.

By means of a mask 60, of a type that conventionally provided in current a process, the formation of heavily doped P+ semiconductor regions (e.g., for forming P-channel MOSFETs of the circuitry) are defined, in correspondence of some of the previously formed N+ drain regions of the memory cells, wherein contacts to the second semiconductor material well 8 will be formed. In order to form such contacts, a P-type dopant is implanted in a dose sufficiently high so as to invert the original N+ doping that was used to form regions 6 as shown in FIG. 6 so that the P+ regions 7 shown in FIG. 2 are formed.

Upon formation of the metallic strips 1 and 2, after the deposition of the dielectric layer 15 and the formation therein of the contact openings 5, 25, and 70, the P+ regions 7 are connected together by forming the metallic strips 3 intercalated to the strips 1 and 2. It should be noted that, as shown in FIGS. 1–5, being the contact openings 70 in the dielectric layer 15 located in regions similar to those of contact openings 25 of strips 2, the strips 3 appear, as far as the distribution of contact openings there along is concerned, exactly a generic strips 2 which are bit lines of the memory array. Thus the strip 3 is positioned in-between the bit lines and has a similar spacing and dimension, yet it provides the P+ contact line and is not a bit line.

A drawback of this first embodiment of the process described above resides in the necessity of inverting the doping of the N+ regions in strips 3 to form the P+ regions 7.

Figure 7:
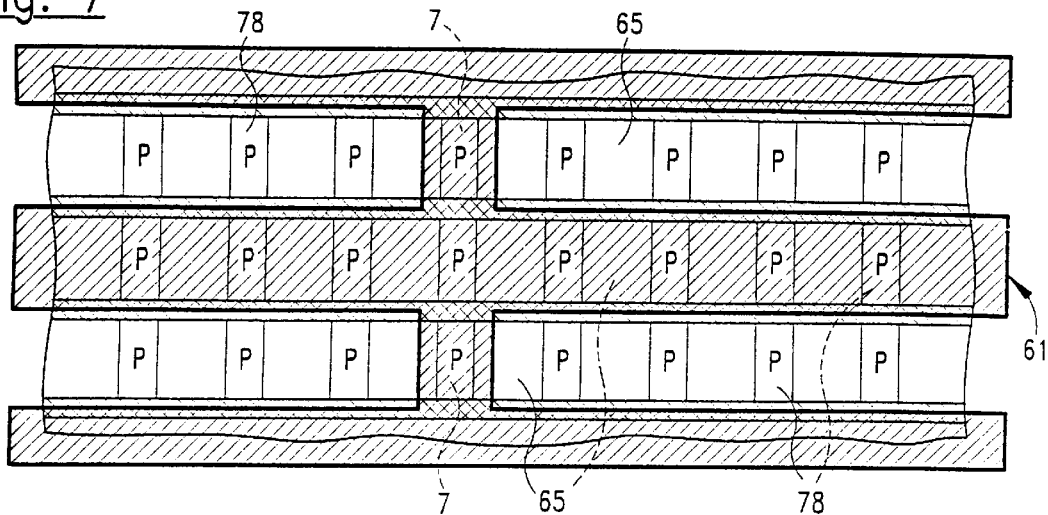
FIGS. 7, 8 and 9 show three steps of a manufacturing process according to another embodiment of the invention.
Figure 8:
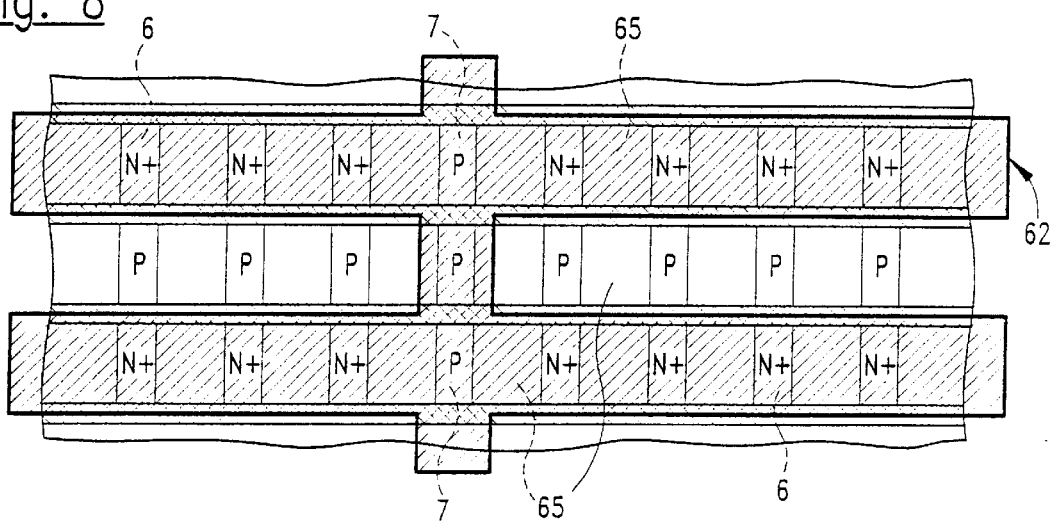
Figure 9:
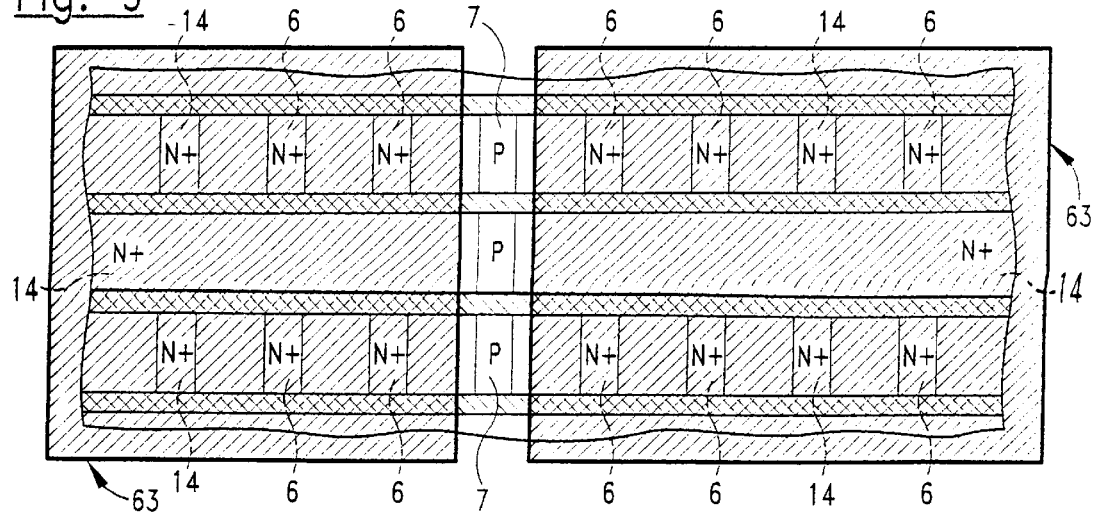

With reference to FIGS. 7, 8 and 9, another process is described that is not affected by the above-mentioned drawback. More particularly, in FIG. 7 it can be noted that upon creation of the N+ drain regions 6 for the memory cells, after having defined the active areas by means of the formation of the thick field oxide, or similar dielectric material, regions 65 and having successively defined the rows 40, the areas of the second semiconductor material well 8 containing the memory array in which the contacts 70 to the second semiconductor material well 8 will be formed are covered by a mask 61, shown with cross-hatching for clarity, so as not to dope the semiconductor in the area covered by the mask. Mask 61 is of a type conventionally provided in the flow of any known manufacturing process for masking the areas in regions of the control circuitry which are not to be implanted by the N-type dopant. FIG. 8 shows the results after doping is carried out with the mask from FIG. 7 in place and the mask 61 has been removed.

During formation of the common source regions 14 (FIG. 8) the areas which will be covered by the metallic strips 3 will be covered by a mask 62 to prevent the underlying semiconductor from being doped. Mask 62 is also of the type conventionally provided in the flow of any known manufacturing process for the selective removal of the field oxide regions 65 in the areas of the memory array wherein the N+ regions 14 are to be formed. By means of a further mask 63 (FIG. 9), corresponding in function to mask 60 of the previous embodiment of the manufacturing process, the areas wherein contacts will be made to the second semiconductor material well 8 are defined and left exposed. Other regions of the array are covered by mask 63. In order to form such contacts, a P-type dopant is implanted in a dose sufficiently high to form, in the second well 8, the P+ regions 7 similar to the P+ regions 7 shown in FIG. 2. After the deposition of the dielectric layer 15 and the formation of contact openings 5, 25, and 70 therein, the P+ regions 7 formed in well 8 are connected by the metallic strips 3 intercalated to strips 1 and 2.

The device obtained by means of the manufacturing process according to this second embodiment differs from the one shown in FIGS. 1 to 5 for the fact that the contact openings 70 to the P-type well 8 are aligned, in the direction of the rows 40, to both contacts 25 between the bit lines 2 and the drain regions 6 of the memory cells, and the contacts 5 between the source metallic strips 1 and the source regions 14 of the memory cells.

Both the embodiments of the manufacturing process for the fabrication of the memory cell arrays have the advantage of not requiring additional process steps with respect to the conventional process flow.

What is claimed is:

1. A memory device comprising:

a semiconductor material substrate with a dopant of a first type;

a first semiconductor material well with a dopant of a second type formed in the substrate;

a second semiconductor material well with a dopant of the first type formed in said first well;

a bidimensional arrangement of memory cells formed in said second well, each cell comprising a first electrode and a second electrode respectively formed by first and second doped regions with dopant of the second type formed in said second well, and a control gate electrode;

a first plurality of strips of conductive material extending over said second well in a first direction and forming rows of memory cells, each strip of the first plurality forming the control gate electrodes of a respective group of memory cells;

a second plurality of strips of conductive material extending over said second well in a second direction substantially orthogonal to said first direction and forming columns of memory cells, each strips of said second plurality electrically contacting the first electrodes of a respective group of memory cells;

a third plurality of strips of conductive material extending over said second well in said second direction and intercalated to the strips of the second plurality, said third plurality electrically contacting the second electrodes of the cells and electrically isolated from the second well; and a fourth plurality of strips of conductive material extending over said second well in said second direction and intercalated to the strips of said second and third pluralities, said strips of the fourth plurality electrically contacting the second well in a succession of contact points distributed longitudinally to each strip of said fourth plurality, said strips of the fourth plurality being electrically isolated from the second electrodes of the cells.

2. The memory device according to claim 1 wherein in correspondence of each of said contact point there is provided, in said second well, a semiconductor region heavily doped with dopant of the first type.

3. The memory device according to claim 1 wherein the strips of said fourth plurality are electrically connected to each other and to a bias potential for said second well.

4. The memory device according to claim 1 wherein a number of the strips of said fourth plurality depends on a resistivity of said second well.

5. The electronic memory device having memory cells integrated on a semiconductor material substrate comprising:

a plurality of conductive parallel row strips and a plurality of conductive parallel column strips substantially orthogonal to the row strips, wherein a first predetermined number of the column strips are electrically connected to a bulk node of the memory cells to bias different zones of an underlying well, wherein the first predetermined number of column strips are electrically isolated from second electrodes of the memory cells, and wherein a second predetermined number of the column strips are electrically isolated from the bulk node.

6. The memory device of claim 5
wherein the semiconductor material substrate is doped with a dopant of a first type, the device further comprising:

a first well placed on the substrate and doped with a dopant of a second type;

a second well placed on the first well and doped with dopant of the first type; and a memory cell array formed within the second well.

7. The memory device of claim 6 wherein the memory cell array comprises:

a bidimensional arrangement of memory cells, each memory cell having first electrode and second electrodes respectively formed by first and second doped regions with dopant of the second type, and a control gate electrode;

a first plurality of strips of conductive material extending in a first direction and forming rows of memory cells, each strip of the first plurality forming a control gate electrode of a first respective group of memory cells;

a second plurality of strips of conductive material extending in a second direction substantially orthogonal to the first direction and forming columns of memory cells, each strip of the second plurality being electrically connected to the first electrodes of a second respective group of memory cells;

a third plurality of strips of conductive material extending in the second direction and intercalating to the strips of second plurality, the strips of the third plurality being electrically connected to the second electrodes of a third respective group of memory cells and electrically isolated from the second well; and a fourth plurality of strips of conductive material extending in the second direction and intercalating to the strips of the second and the third pluralities, each strip of the fourth plurality being electrically connected to the second well through succession of contact points of each strip of the fourth plurality, wherein each strip of the fourth plurality are electrically isolated from the second electrodes of the memory cells.

8. The memory device of claim 7 wherein the contact points are formed by regions heavily doped with dopant of the first type within the second well.

9. The memory device of claim 7 wherein the strips of the fourth plurality are electrically connected to each other and to a bias potential of the second well.

10. The memory device of claim 7 wherein a number of the strips of the fourth plurality depends on a resistivity of the second well.

* * * * *